(12) United States Patent
Rieven

(10) Patent No.: US 6,580,304 B1
(45) Date of Patent: Jun. 17, 2003

(54) APPARATUS AND METHOD FOR INTRODUCING SIGNAL DELAY

(75) Inventor: Stephen Andrew Rieven, Sterling, MA (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/109,016

(22) Filed: Mar. 28, 2002

(51) Int. Cl.[7] ............................................. H03H 11/26
(52) U.S. Cl. ...................... 327/276; 327/261; 327/262; 327/269; 327/270; 327/276; 327/152; 327/153; 327/158; 327/161
(58) Field of Search ................................ 327/261, 262, 327/269, 270, 276, 152, 153, 158, 161

(56) References Cited

U.S. PATENT DOCUMENTS

| | | | |
|---|---|---|---|
| 3,996,481 A | 12/1976 | Chu et al. ........................ | 327/2 |
| 4,496,861 A | 1/1985 | Bazes ............................ | 327/161 |
| 5,179,303 A | 1/1993 | Searles et al. ................. | 327/277 |
| 5,552,878 A | 9/1996 | Dillard .......................... | 356/5.07 |
| 5,614,855 A | 3/1997 | Lee et al. ..................... | 327/158 |
| 5,684,421 A | 11/1997 | Chapman et al. ............... | 327/261 |
| 6,060,928 A | * 5/2000 | Jun et al. ..................... | 327/261 |
| 6,100,735 A | * 8/2000 | Lu ............................... | 327/158 |
| 6,323,705 B1 | * 11/2001 | Shieh et al. .................. | 327/158 |

OTHER PUBLICATIONS

TTCrx Reference Manual, "A Timing, Trigger and Control Distribution Receiver ASIC for LHC Detectors", Jul. 1997 Version 2.2, Christiansen et al, 4 pages.

Jorgen Christiansen, An Integrated High Resolution CMOS Timing Generator Based on an Array of Delay Locked Loops, IEEE Journal of Solid State Circuits, vol. 31, No. 7, Jul. 1996, pp. 952–957.

* cited by examiner

Primary Examiner—Tuan T. Lam

(57) ABSTRACT

A precision signal delay apparatus and method for introducing time delay to a signal. Precision delay is introduced by a pair of delay locked loops (DLLs) connected in series each with selectable delay (i.e., a Vernier-type circuit). Nonuniformity in the precision delay is compensated with a delay compensation circuit. The apparatus and method may be used for phase shifting, data delay, precision pulse width modulation, and precision time windowing.

20 Claims, 6 Drawing Sheets

APPARATUS AND METHOD FOR INTRODUCING SIGNAL DELAY

FIELD OF THE INVENTION

The present invention relates to electronics and, more particularly, to apparatus and methods for introducing signal delay.

BACKGROUND OF THE INVENTION

Presently, there is a need for signal delay circuits capable of introducing a high precision delay to various signals. For example, in High Range Resolution (HRR) Radar systems, delay circuits are needed to generate intervals between transmit pulses and receive pulses with a resolution finer than 200 pico (p) seconds (s). Due to practical considerations, the delay circuits must be inexpensive, reliable, and small.

One well known method for generating a delay involves the use of a resistor and capacitor (RC) circuit. In an RC circuit, as the voltage applied to the RC circuit changes, the voltage across the capacitor gradually changes in a predictable manner to match the new voltage applied to the RC circuit. The time it takes the capacitor to transition from one voltage level to another voltage level in response to a predetermined change in the applied voltage level defines a predictable time interval, which may be used to generate a delay. Although inexpensive, this method is susceptible to noise that adversely affects its reliability.

Another method for generating a signal delay is depicted in FIG. 1. FIG. 1 is a block diagram of a known tapped delay locked loop (TDLL) 10 for shifting the phase of a periodic input signal. The TDLL 10 includes a delay chain 12 with (N) identical delay elements 14, a comparator 16, and a multiplexer 18. Typically, the delay elements are fabricated as a single integrated circuit (IC) on a silicon wafer. Therefore, the delay elements are essentially identical and will each introduce an equal amount of delay to a signal passing through them.

In operation, an input signal received at an input port (IN) of the TDLL 10 is passed simultaneously to one input port at the comparator 16 and through the delay chain 12. After passing through the delay chain 12, a delayed version of the input signal is fed back to the other input port of the comparator 16 where its phase is compared to the phase of the input signal. The comparator 16 produces an error signal that is fed to each of the delay elements within the delay chain 12 to control the amount of delay provided by each delay element. Since the delay elements are identical, applying the error signal to each delay element will adjust each delay element by an equivalent amount. The comparator 16 adjusts its output (the error signal) until its two inputs are equal, which occurs when the phase of the input signal matches the phase of the input signal as delayed by the delay chain 12. This occurs when the delayed signal is delayed exactly one period of the input signal. When the phases match, after at least one period of the input signal, the TDLL 10 is "locked," and the input signal as delayed by the delay chain 12 is identical to the received input signal delayed by one period of the input signal.

Each delay element within the delay chain 12 successively introduces delay to the input signal as it passes through the delay chain 12, where each successive delay is commonly referred to as a "step." If each of the delay elements within the delay chain 12 is "tapped," each tap will produce a signal identical to the input signal delayed by a fraction of the period of the input signal. That fraction is given by the number of delay elements the input signal has passed through divided by the total number of delay elements (N) in the delay chain 12. The multiplexer 18 is coupled to the taps of the individual delay elements and is used to select one of the taps in response to a selection signal received at a selection port (Sel) to provide a desired delay.

The TDLL 10 is capable of introducing a delay to a periodic input signal. However, since the TDLL 10 takes at least one period of the input signal to "lock," it is not suitable for delaying individual (or variable period) pulses. In addition, each step produced within a period of the input signal requires an additional delay element. Accordingly, systems requiring a large number of steps (i.e., high resolution) will require a large number of delay elements. As the number of delay elements increases, however, it becomes increasingly difficult to ensure that the individual delay elements will match, thus adversely affecting linearity.

FIG. 2 is a block diagram of a known "Vernier-type" circuit 20 for shifting the phase of a periodic input signal with a high level of precision. The circuit 20 includes a first TDLL identical to the TDLL 10 of FIG. 1 (with like elements being identically numbered) and a second TDLL 22 similar to the TDLL 10 of FIG. 1. The second TDLL 22 includes a second delay chain 24 with (N−1) identical delay elements 26, a second comparator 28, and a second multiplexer 30. Typically, the first and second delay chains 12, 24 are fabricated on a silicon wafer, with the delay elements of the first delay chain 12 being essentially identical to each other and the delay elements of the second delay chain 22 being essentially identical to each other. The output of the first multiplexer 18 is used as the input signal to the second TDLL 22. Therefore, the first TDLL 10 introduces a first delay, and the second TDLL 22 introduces a second delay to the input signal as delayed by the first TDLL 10.

The Vernier-type circuit 20 of FIG. 2 enables very fine step sizes with fewer delay elements than a single TDLL such as TDLL 10. By connecting the first and second TDLLs 10, 22 in series, a large number of steps can be achieved using a relatively small number of delay elements, thus enabling the delay elements to be more easily matched. The number of steps is given by the product of the number of delay elements (N) in the first delay chain 12 and the number of delay elements (N−1) in the second delay chain 24. As long as the number of delay elements in the second delay chain 24 is either (N+1) or (N−1), the step size will be the period of the input signal divided by that product. For example, if N=16, the step size will be one input signal period/(16*15)=1/240. Accordingly, if the input signal is 100 MHZ, the delay will be approximately 40 ps per step [(1/100 MHZ)/(16*15)=41.7 ps]. In this example, only 31 delay elements are required to achieve 240 steps (15×16=240). A single TDLL such as the TDLL 10 of FIG. 1 would require 240 delay elements to provide 240 steps.

FIG. 2A is a table 32 depicting the delay steps associated with a Vernier-type circuit 20 having a first delay chain 12 with N delay elements (vertical axis) and a second delay chain 24 with N−1 delay elements (horizontal axis) where N=5. Thus, this circuit 20 provides 5*4=20 delay steps. Each delay element in the first delay chain 12 will introduce a delay step that is ⅕ (or 0.200) of an input signal period; and each delay element in the second delay chain 24 will introduce a delay step that is ¼ (or 0.250) of the input signal period. Accordingly, the circuit 20 is capable of introducing delays between 0.450 of an input signal period if the minimum delay is introduced by each delay chain 12, 24 and 2.000 times the input signal period if the maximum delay is introduced by each delay chain 12, 24.

The delay steps of the Vernier-type circuit 20 are spread over two periods of the input signal. Therefore, some of the delay steps are time delays of a fraction of the input signal period and thus the delayed signal appears within one period of the input signal, while other delay steps are time delays of a fraction of the input signal period plus one entire period of the input signal and thus the delayed signal appears between one and two periods of the input signal. For example, as depicted in table 32, delay steps identified by numerals 9, 13–14, and 17–19 introduce a delay that is a fraction of the input signal period, while delay steps identified by numerals 1–8, 10–12, 15–16, and 20 introduce a delay that is a fraction of the input signal period plus one entire period of the input signal. A description of the delay steps for a Vernier-type circuit 20 can be found in TTCrx Reference Manual: a Timing, Trigger and Control Receiver ASIC for LHC Detectors (Appendix A), Version 3.0, Christiansen et al., CERN-EP/MIC, Geneva, Switzerland, October 1999, incorporated fully herein by reference.

For periodic input signals, after at least one period of the input signal, the delays introduced by the Vernier-type circuit 20 will appear to be within one period of the input signal. For example, delay step (1) will delay a first pulse by $\frac{1}{20}$th of the input signal plus one full period of the input signal. Thereafter, however, since the output signal will be periodic and will have the same period as the input signal, the input signal will appear to be delayed by just $\frac{1}{20}$th of its period. The bracketed numerals in FIG. 2A represent the apparent sequential delay introduced by the Vernier-type circuit (for N=5). For example, delay step (1) will produce an apparent delay of $\frac{1}{20}$th of the period of the input signal, delay step (2) will produce an apparent delay of $\frac{2}{20}$ths of the period of the input signal, etc.

For single pulses, however, the delay steps will appear "nonuniform" in the sense that the delay steps will be spread over two periods of the input signal in a non-sequential manner. For example, the first delay step (1) will delay a pulse by a fraction of the input period plus one full period of the input signal (i.e., 1 input period +$\frac{1}{20}$th of the input period). On the other hand, delay step (9), although its apparent delay is greater than the apparent delay of delay step (1), will delay a pulse by only a fraction of the input period (i.e., $\frac{9}{20}$ths of the input period).

Although the Vernier-type circuit 20 offers very high precision, as with the first TDLL 10 described in reference to FIG. 1, at least one period of the input signal is required to lock each TDLL 10, 22, thereby preventing the circuit 20 from being used to delay single (or variable period) pulses. In addition, although the delay step sizes are small, as described in reference to FIG. 2A, they are spread in a nonuniform manner over two input signal periods.

Accordingly, for the reasons discussed above, there is a need for apparatus and methods for introducing high precision delays that are reliable, uniform, and can be used for delaying individual (or variable) pulses. The present invention fulfills this need among others.

SUMMARY OF THE INVENTION

The present invention provides a method and apparatus for introducing delay to a signal that overcomes the aforementioned problems by using a pair of TDLLs connected in series to introduce a precision delay, and compensating for nonuniformity in the precision delay with a delay compensation circuit. In accordance with certain embodiments, each of the TDLLs in the pair of TDLLs contains a pair of delay chains having identical delay elements, where one of the delay chains is coupled to a periodic clock and is used to set the step size of the other delay chain (as well as its own step size); and the second delay chain is coupled to an input signal to introduce delay to the input signal. Accordingly, since the delay for both delay chains is set by the periodic clock using one delay chain, the other delay chain may be used to introduce precise delay to an input signal without locking to the input signal, thus enabling the circuit to delay individual pulses and variable period signals in addition to periodic signals.

One aspect of the invention is an apparatus for introducing delay to a signal. The apparatus includes a first delay circuit configured to introduce a first delay to the signal, the first delay selected from a first set of delays within a first range and a second set of delays within a second range, a delay compensation circuit coupled to the first delay circuit, the delay compensation circuit configured to selectively introduce a second delay to the signal, and a control coupled to the first delay circuit and the delay compensation circuit, the control for configuring the first delay circuit to select the first delay and configuring the delay compensation circuit to introduce the second delay when the first delay is selected from the first set of delays within the first range.

Another aspect of the invention is an apparatus for introducing delay to a signal. The apparatus includes a comparator having a first input for receiving a clock signal, a second input for receiving a feedback signal, and an output for producing an error correction signal; a first delay chain having an input port for receiving the clock signal, an output port for producing the feedback signal, and a first set of delay elements, each delay element of the first set of delay elements having an error correction port for receiving the error correction signal; a second delay chain having an input port for receiving the signal and a second set of delay elements having at least as many delay elements as the first set of delay elements, each delay element of the second set of delay elements having an error correction port for receiving the error correction signal and a tap port for producing a delayed version of the signal; a selector having a plurality of inputs coupled to the tap ports of the second delay chain, a control port for receiving a selector signal to select one of the tap ports, and an output for passing one of the delayed versions of the signal.

Another aspect of the present invention is a method for producing uniform delay steps in a Vernier-type circuit capable of introducing a first set of delays within a first range and a second set of delays within a second range. The method includes receiving a delay indicator specifying an amount of delay to add to a signal, introducing a first delay to the signal with the Vernier-type circuit, and introducing a second delay to the input signal if the first delay is within the first range, the first and second delays together producing a third delay that is within the second range.

DETAILED DESCRIPTION OF THE INVENTION

Figure 3:
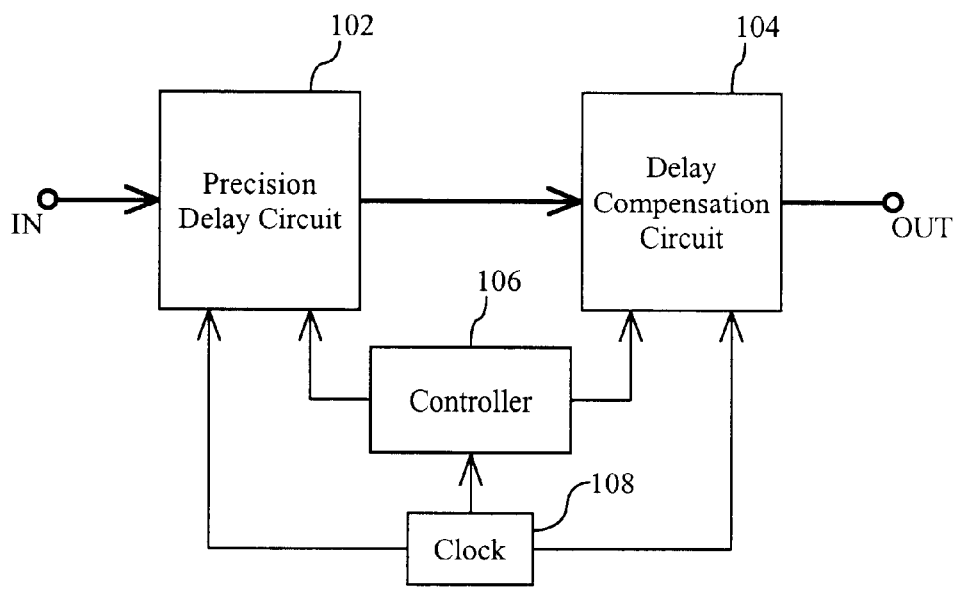
FIG. 3 is a block diagram of an embodiment of a delay system in accordance with the present invention.

It FIG. 3 is a block diagram 100 representing an overview of a circuit for introducing a precision delay into an input signal in accordance with one embodiment of the present invention. The block diagram 100 includes a precision delay circuit 102 to introduce a precision delay to an input signal received at an input port (IN), a delay compensation circuit 104 to selectively add additional delay (i.e., compensation delay) to the input signal, a controller 106 to control the precision delay circuit 102 and the delay compensation circuit 106, and a clock 108 to produce a periodic signal. The input signal as delayed by the precision delay circuit 102 and the delay compensation circuit 104 is output at an output port (OUT).

The precision delay circuit 102 is capable of generating a plurality of different delay steps that are spread in a non-uniform manner over two different ranges. The delay compensation circuit 104 functions to add a compensation delay to the input signal when the precision delay to be added to the input signal falls in a particular one of the ranges such that all delay steps essentially fall within the same range. In a preferred embodiment, the two different ranges of the precision delay circuit 102 cover two consecutive clock periods of the clock 108, with each of the ranges corresponding to a separate clock period. In this embodiment, the delay compensation circuit 104 adds a one clock period delay if the delay introduced by the precision delay circuit 102 falls within the first clock period, i.e., the first range. Therefore, all of the delay steps introduced by the precision delay circuit 102 will effectively fall within a single clock period, i.e., the second range. As will be illustrated in the following discussion of detailed embodiments, the compensation delay can be added to the input signal prior to the precision delay, after the precision delay, or, by including the delay compensation circuit 104 as part of the precision delay circuit 102, substantially simultaneously with the precision delay.

Figure 4:
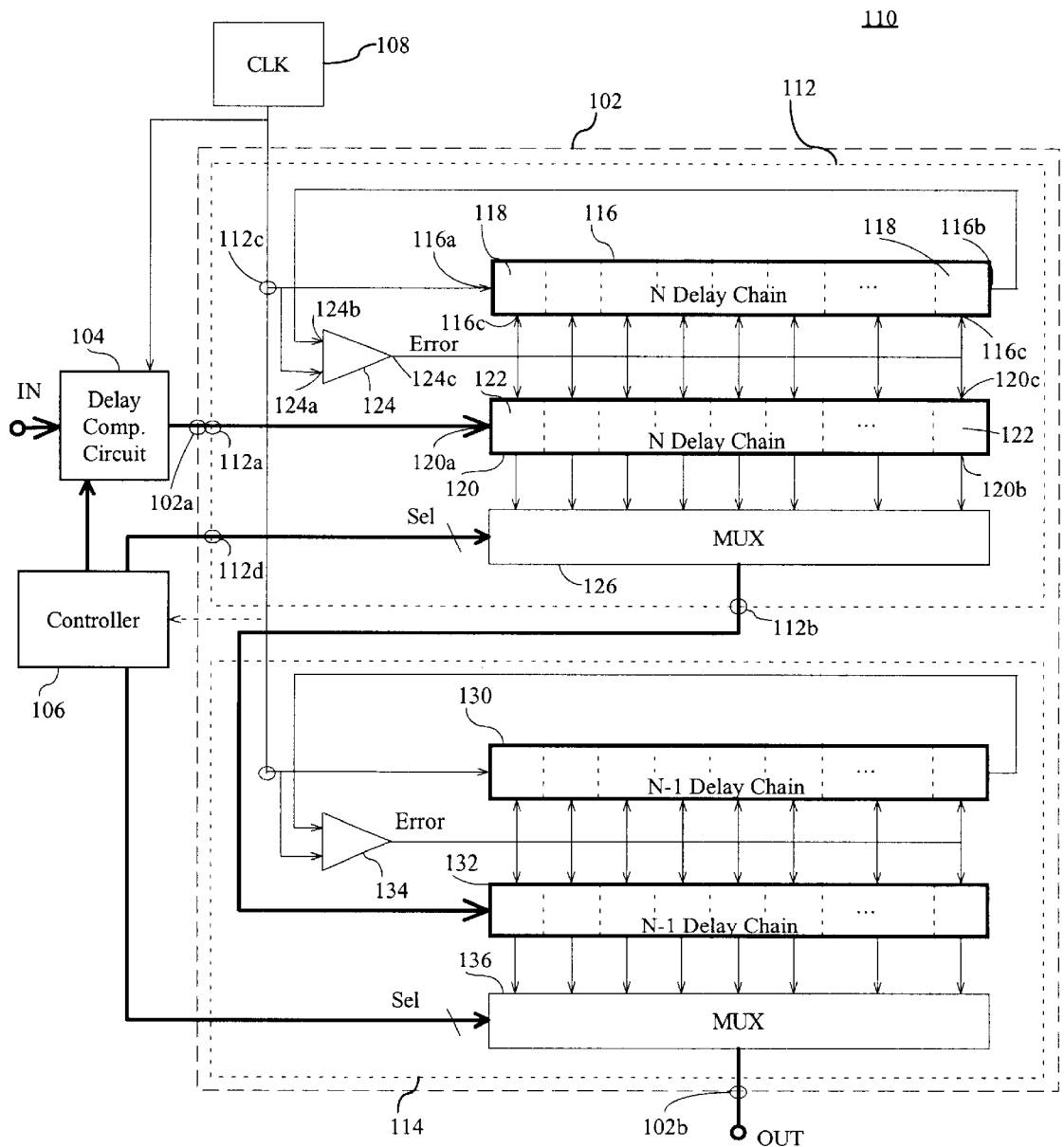
FIG. 4 is a schematic diagram of an embodiment of a delay system in accordance with the present invention.

FIG. 4 depicts an embodiment of a delay system 110 in accordance with the present invention. The delay system 110 includes a precision delay circuit 102, a delay compensation circuit 104, a controller 106, and a clock 108. In general overview, an input signal is received at an input port (IN). The input signal is passed through the delay compensation circuit 104 where, if needed, a compensation delay is introduced; and through the precision delay circuit 102 where a precision delay is introduced. The controller 106 controls the amount of delay added by the precision delay circuit 102. In addition, for certain precision delays introduced by the precision delay circuit 102, the controller 106 will prompt the delay compensation circuit 104 to add a compensation delay to the input signal.

The delay system 110 will now be described in greater detail. The clock 108 provides timing and synchronization information. In the illustrated embodiment, the clock 108 is coupled to the precision delay circuit 102, the delay compensation circuit 104, and the controller 106. In a preferred embodiment, the clock 108 is a conventional clock that generates a periodic signal for use in digital circuits. The selection of a suitable clock for use with the present invention will be readily apparent to those skilled in the art.

The precision delay circuit 102 introduces precision delay to an input signal received at an input port 102a to produce a precision delayed version of the input signal at an output port 102b. In the illustrated embodiment, the precision delay circuit 102 includes a first TDLL 112 and a second TDLL 114 connected in series, i.e., a Vernier-type circuit. Therefore, as in the Vernier-type circuit 20 (FIG. 2) discussed above, the delay steps introduced by the precision delay circuit 102 will span two ranges, namely, within 1 clock period of the original input signal and between 1 and 2 clock periods of the original input signal.

The first TDLL 112 adds a first component of the precision delay to the input signal. In the illustrated embodiment, the first TDLL 112 includes a first delay chain 116 having a first set of delay elements including (N) identical delay elements 118, a second delay chain 120 having a second set of delay elements including at least (N) identical delay elements 122, a first comparator 124, and a first multiplexer 126. The first TDLL 112 receives an input signal at an input port 112a and generates a delayed signal at an output port 112b that is a version of the input signal delayed by the first component of the precision delay. In addition, the first TDLL 112 is coupled to the clock 108 through a clock port 112c and to the controller 106 through a control port 112d.

As will be described in detail below, the first comparator 124 establishes the amount of delay introduced by each of the delay elements 118 in the first delay chain 116 and also establishes the amount of delay introduced by each of the delay elements 122 in the second delay chain 120, which is the delay chain that actually introduces the delay to the input signal. In a preferred embodiment, the comparator 124 is a conventional electronic circuit that can be fabricated on a semiconductor wafer and can generate a signal at its output for controlling the delay introduced at each delay element. The selection of a suitable comparator for use with the present invention will be readily apparent to those skilled in the art.

The first delay chain 116 includes an input port 116a, an output port 116b, and a plurality of error correction ports 116c (one for each delay element 118 in the first delay chain 116). A signal received at the input port 116a will result in a signal at the output port 116b that is delayed by all of the delay elements in the delay chain 116. The error correction ports 116c are all coupled to an output port 124c of the comparator 124 to receive an identical error correction signal generated by the comparator 124. Since each individual delay element receives the same error correction signal and the delay elements are essentially identical, the error correction signal changes the delay period associated with each delay element by an equal amount. In a preferred embodiment, the delay elements are made essentially identical by fabricating them in a known manner as a single integrated circuit on a silicon wafer. As will be readily apparent to those in the art, the delay elements could be fabricated using other semiconductor materials such as Galium Arsenide to achieve delay elements with quicker response times.

In the illustrated embodiment, the clock 108 is coupled to the input port 116a of the first delay chain 116 and the first input port 124a of the comparator 124. The delayed clock signal at the output port 116b of the first delay chain 116 is coupled to a second input port 124b of the comparator 124. The comparator 124 compares the phase of the clock signal to the phase of the delayed signal out of the first delay chain 116 and generates the error correction signal. The comparator 124 modifies the error correction signal based on feedback from the output 116b of the first delay chain 116 until the phase of the delayed signal out of the first delay chain 116 matches the phase of the clock signal, thereby indicating that the delayed signal is delayed by one full clock period and that the delay through the first delay chain 116 is one clock period.

The second delay chain 120 introduces the first component of the precision delay to the input signal. The second delay chain 120 includes an input port 120a, tap ports 120b for each delay element, and error correction ports 120c for each delay element. An input signal received at the input port 120a will result in delayed versions of the input signal at each tap port with each tap port producing a version of the input signal delayed proportionally to the number of delay elements the signal travels through to reach a particular tap port.

The second delay chain 120 includes at least as many delay elements as the first delay chain 116 and, preferably, includes the same number of delay elements. If the second delay chain 120 includes more delay elements than the first delay chain 116, the first TDLL 112 will be capable of introducing delays that are longer than a clock period. In a preferred embodiment, the delay elements of the second delay chain 120 are made essentially identical to one another and to the delay elements of the first delay chain 116. The delay elements are made essentially identical by fabricating both of the delay chains 116, 120 in a known manner on a single integrated circuit on a semiconductor wafer.

In the illustrated embodiment, the input port 120a of the second delay chain 120 is coupled to receive the input signal through the delay compensation circuit 104. The error correction ports of the delay elements in the second delay chain 120 are all coupled to the output port 124c of the comparator 124 to receive an identical error correction signal generated by the comparator 124.

Figure 1:
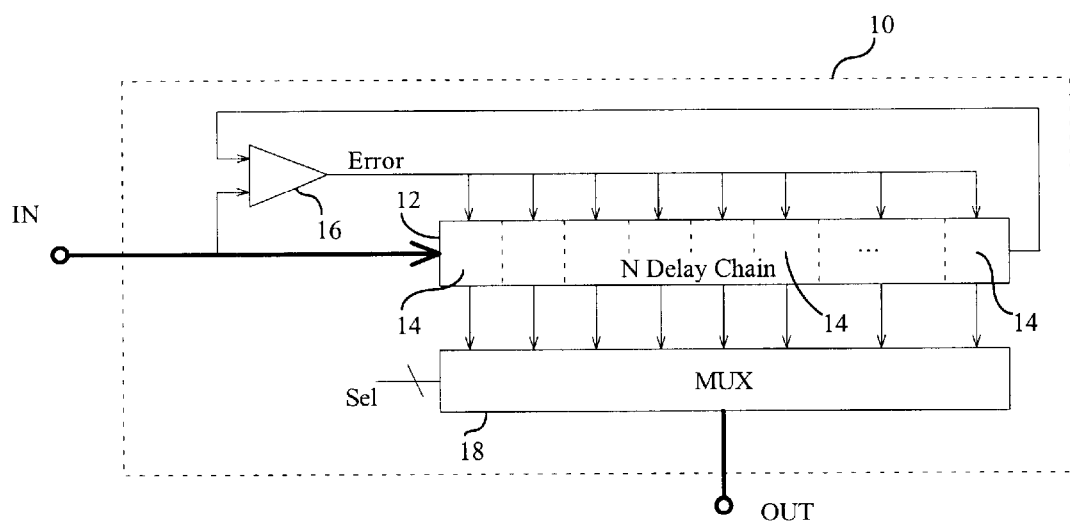
FIG. 1 is a schematic diagram of a prior art TDLL.
Figures 2, 2A:
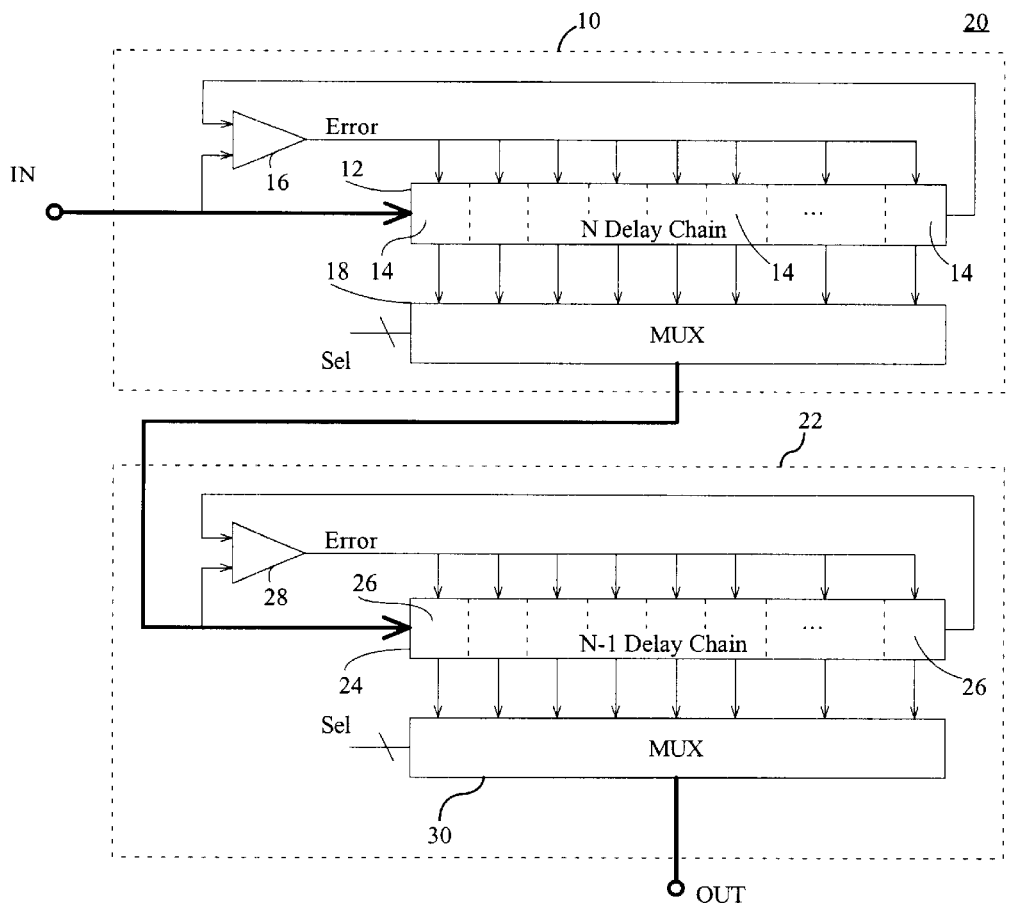
FIG. 2 is a schematic diagram of a prior art Vernier-type circuit.
FIG. 2A is a table illustrating the delay steps generated by a Vernier-type circuit similar to FIG. 2 with N=5.

In accordance with this arrangement, the individual delay elements of the first delay chain 116 provide delay periods of equally spaced fractions of the clock period, as opposed to the equally spaced fractions of the period of the input signal provided in the prior art circuit of FIGS. 1 and 2. The same error correction signal (the output signal of the comparator 124) is also used to change the delay period associated with each delay element 122 of the second delay chain 120. Hence, the delay period added to the input signal by each delay element of the second delay chain 120 is the same as for each element of the first delay chain 116. That is, the delay elements of the second delay chain 120 add delay to the input signal in equal fractional increments of the clock period, not the input signal period.

The tap ports of the delay elements of the second delay chain 120 are coupled to the multiplexer 126 to pass delayed versions of the input signal. The multiplexer 126 is a selector used to select the version of the input signal as delayed by the second delay chain 120 with the appropriate amount of delay. The multiplexer 126 is coupled to the taps of each of the delay elements in the second delay chain 120 through a plurality of input ports. In addition, the multiplexer 126 is coupled to the controller 106 to receive a selection signal. Based on the selection signal, the multiplexer 126 selects one of the delayed versions of the input signal from the second delay chain 120 and passes it to the output port 112b of the first TDLL 112. The signal on the output port 112b is the input signal delayed by the first component of the precision delay.

In a preferred embodiment, the multiplexer 126 is fabricated on a semiconductor wafer using conventional technology. The multiplexer 126 is designed such that the signal propagation time through the multiplexer 126 from each one of its inputs to its output is matched, i.e., essentially identical. The design of a suitable multiplexer 126 will be readily apparent to those skilled in the art of integrated circuits.

By using the first delay chain 116 to lock to a periodic signal from the clock 108 and establish the delay for the individual elements in the first and second delay chains 116, 120 and using the second delay chain 120 to introduce delay to the input signal, the TDLL 112 is capable of introducing delay to individual (or variable period) pulses. This is accomplished by effectively removing the need for a locking period to the input signal since the first and second delay chains 116, 120 are essentially pre-locked to the clock signal of the clock 108.

The second TDLL 114 introduces a second component of the precision delay to the delayed version of the input signal from the first TDLL 112. The second TDLL 114 includes a third delay chain 130, a fourth delay chain 132, a second comparator 134, and a second multiplexer 136. The second TDLL 114 is identical to the first TDLL 112 with the exception that the number of delay elements in the third and fourth delay chains 130, 132 are different from the number of delay elements (N) in the first and second delay chains 116, 120. Accordingly, the components and their functionality in the second TDLL 114 are essentially identical to those of the first TDLL 112 and will be described only where necessary.

The second TDLL 114 adds the second component of the precision delay to the input signal such that the input signal is delayed by the first and second components of the precision delay (and the compensation delay, if added) to produce an output signal at the output port 102b of the precision delay circuit 102 that is delayed by the precision delay of the precision delay circuit 102. In a preferred embodiment, the number of delay elements in the first delay chain 116 is N and the number of delay elements in the third delay chain 130 is either N+1 elements or N−1 elements, which enables the delay system 110 to introduce delay in equal fractional steps of the clock signal.

The delay compensation circuit 104 is a conventional delay circuit for introducing delay to a signal. The delay compensation circuit 104 is coupled to the precision delay circuit 102 for introducing a compensation delay to the input signal to accommodate nonuniformity in the precision delay introduced by the precision delay circuit 102. The delay compensation circuit 104 is coupled to the clock 108 to receive the clock signal for synchronization. The delay compensation circuit 104 may be a known counter or shift register. Other circuits suitable for use in the present invention will be readily apparent to those skilled in the art.

In a preferred embodiment, the delay compensation circuit 104 is controlled by the controller 106 to either introduce a one clock period delay to the input signal or to do nothing to the input signal. In the illustrated embodiment, the precision delay circuit 102 receives the input signal through the delay compensation circuit 104. Accordingly, the delay compensation circuit 104 will introduce a compensation delay to the input signal prior to the precision delay circuit 102 introducing a precision delay to the input signal. Although the delay compensation circuit 104 in the illustrated embodiment is coupled to the input of the precision delay circuit 102, it will be readily apparent to those skilled in the art that the delay compensation circuit 104 may be coupled to the output of the precision delay circuit 102.

The controller 106 controls the amount of delay introduced by the precision delay circuit 102 and the delay compensation circuit 104. In the illustrated embodiment, the controller 106 is coupled to the selection ports (Sel) of the first and second multiplexers 126, 136 of the precision delay circuit 102. The controller 106 selects the amount of delay introduced by the precision delay circuit 102 by selecting a tap port in the second delay chain 120 using the first multiplexer 126 and selecting a tap port in the fourth delay chain 132 using the second multiplexer 136. Based on the selected tap ports of the second and fourth delay chains 120, 132, the controller 106 will instruct the delay compensation circuit 104 to add compensation delay to the input signal. The controller 106 may be a micro-controller, microprocessor, digital signal processor, state machine, or essentially any device for processing signals.

In use, the controller 106 controls the delay compensation circuit 104 such that precision delay introduced to the input signal by the precision delay circuit 102 are in a single range, e.g., a single clock period. For example, referring to table 32 (FIG. 2A), assume the precision delay circuit 102 is capable of generating the depicted delay steps. If the controller 106 configures the precision delay circuit 102 to generate delay step 9 (i.e., 0.450), the delay step falls within the first clock period, e.g., between 0 delay and a one clock period delay. However, if the controller 106 configures the precision delay circuit 102 to generate delay step 1 (i.e., 1.050) the delay step falls within the second clock period, e.g., between a one clock period delay and a two clock period delay. Accordingly, the controller 106 will instruct the delay compensation circuit 104 to introduce a compensation delay, e.g., one clock period, to the signal when the precision delay circuit 102 is configured to generate a delay step that is in the first clock period, such as step 9, thereby effectively shifting the precision delay for delay step 9 to the second range. By introducing the compensation delay whenever the precision delay circuit 102 will introduce a delay in the first clock period, all twenty delay steps can be effectively placed within one clock period, namely, the second clock period.

Figure 4A:
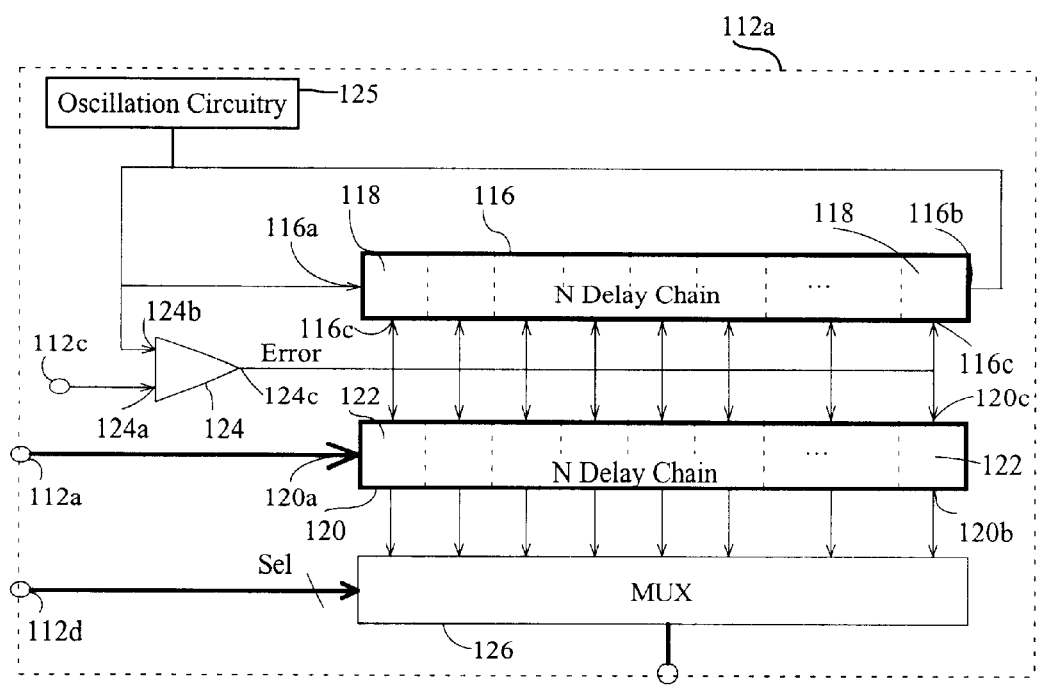
FIG. 4A is a schematic diagram of an alternative TDLL for use in the delay system of FIG. 4.

In an alternative embodiment, depicted in FIG. 4A, the first and/or second TDLLs 112 (FIG. 4) are configured as ring oscillators TDLL 112a. The TDLL 112a is similar to the TDLL 112 described above, with like elements labeled identically in the Figures, except that the clock 108 is coupled within the TDLL 112a solely to the first input port 124a of the comparator 124, rather than to both the input port 116a of the first delay chain 116 and the first input port 124a of the comparator 124. Also, the delayed signal at the output port 116b of the first delay chain 116 is coupled to the input port 116a of the first delay chain 116 in addition to the second input port 124b of the comparator 124. In this embodiment, known oscillation initiation circuitry 125 initiates oscillations in the TDLL 112a that result in an oscillation signal out of the first delay chain 116. The comparator 124 then compares the clock signal to the oscillation signal to generate the error correction signal used to establish the amount of delay introduced by each of the delay elements in the first and second delay chains 116, 120. The comparator 124 modifies the error correction signal based on feedback from the output 116b of the first delay chain 116 until the phase of the oscillation signal out of the first delay chain 116 matches the phase of the clock signal, thereby indicating that the delayed signal is delayed by one full clock period and that the delay through the first delay chain 116 is one clock period.

Figure 5:
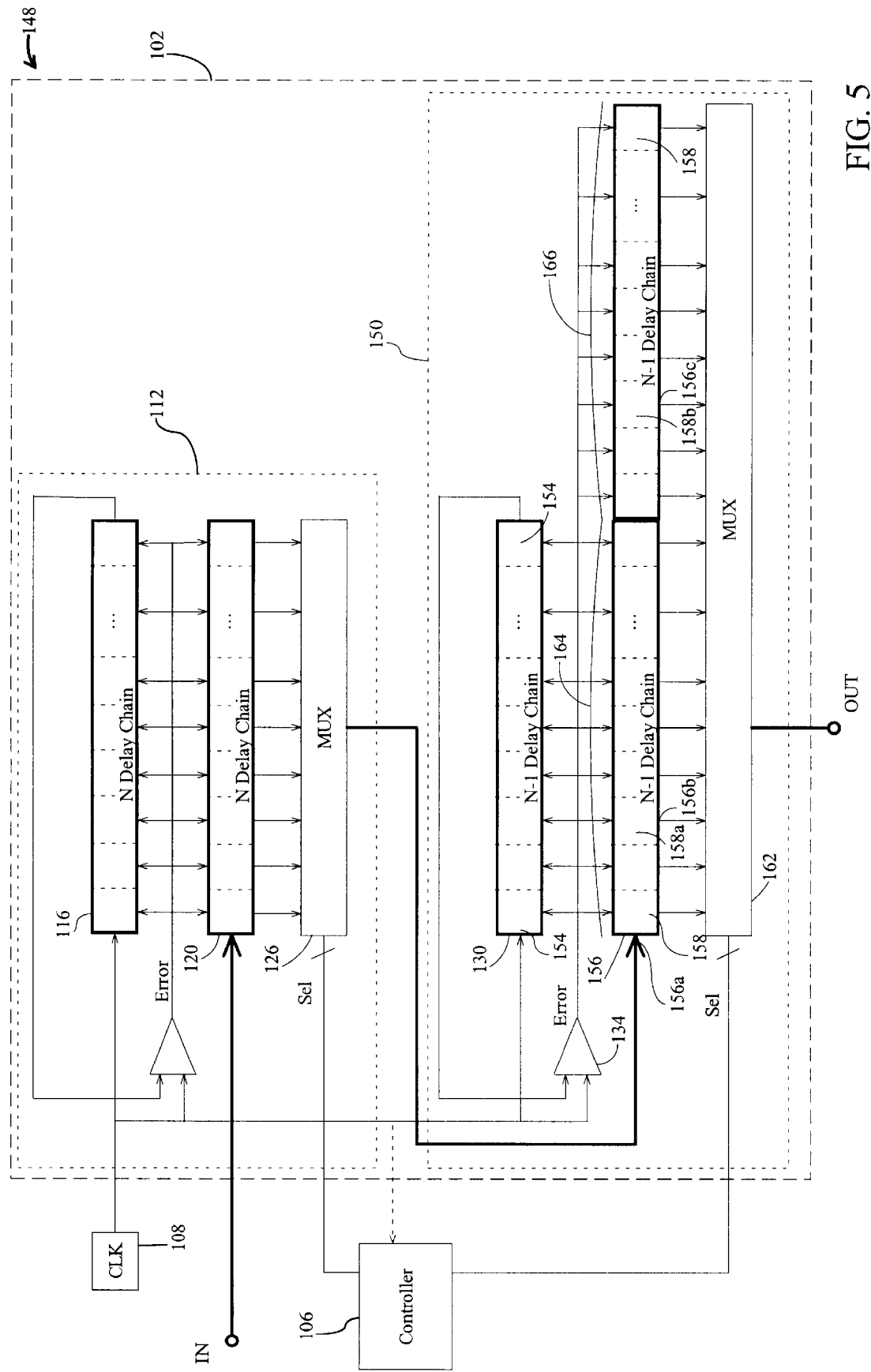
FIG. 5 is a schematic diagram of an alternative embodiment of a delay system in accordance with the present invention.

FIG. 5 depicts an embodiment of an alternative delay system 148 for delaying an input signal. The delay system is identical to the delay system 110 of FIG. 4 with the exception that the second TDLL 114 (FIG. 4) in the precision delay circuit 102 is replaced with an extended TDLL 150. Accordingly, only the relevant differences will be discussed in detail below, with like elements labeled identically in the Figures. The extended TDLL 150 includes an extended delay chain 156 that allows it to perform the function of the delay compensation circuit 104 (FIG. 4) in addition to introducing the second component of the precision delay. Therefore, a separate component to introduce compensation delay is not necessary in the alternative delay system 148.

The extended TDLL 150 includes a first delay chain 130 with (N−1) identical delay elements 154, an extended delay chain 156 with at least [(N−1)+(N−1)] identical delay elements 158, a comparator 134, and an extended multiplexer 162. The second delay chain 156 includes a base delay chain 164 and an extension delay chain 166, the extension delay chain 166 having at least as many delay elements at the base delay chain 164. The delay elements in the first and second delay chains 130, 156 are essentially identical. In a preferred embodiment, the delay elements are made essentially identical by fabricating the delay chains 130, 156 adjacent to one another in a known manner on a semiconductor wafer as a single integrated circuit (IC). The number of delay elements in the extended delay chain 156 is at least twice the number of delay elements in the first delay chain 152 of the extended TDLL 150.

The comparator 134 establishes the amount of delay introduced by each of the delay elements in the first and the extended delay chains 130, 156 as described above in reference to FIG. 4. The extended delay chain 156 introduces the second component of the precision delay to the input signal and, if needed, the extended delay chain 156 introduces compensation delay to the input signal.

In the illustrated embodiment, the extended delay chain 156 includes twice as many delay elements as the first delay chain 130. Accordingly, the extended delay chain 156 is capable of delaying the input signal by up to twice the delay through the first delay chain 130, i.e., two clock periods. The base delay chain 164 is used to add the second component of the precision delay if delay compensation is not necessary. If delay compensation is necessary, the extension delay chain 166 is used to add the second component of the precision delay. It will be readily apparent to those skilled in the art that if the number of delay elements in the extended delay chain includes more than twice as many delay elements as the first delay chain 130, the extended delay chain 156 will be capable of introducing delays that are greater than two clock periods.

The delay elements in the extension delay chain 166 can be used to add a delay that is the equivalent of the corresponding delay element in the base delay chain 164 plus one clock period. For instance, between an input port 156a of the extended delay chain 156 and a tap port 156b of the third delay element 158a within the base delay chain 164 a delay of 3/N−1 of a clock period is introduced, whereas between the input port 156a and a tap port 156c of the third delay element 158b within the extension delay chain 166 a delay of (1+3/N−1) clock cycles is introduced. Thus, the extended delay chain 156 serves the function of both the second precision delay component and delay compensation. For example, assume each delay element of the extension delay chain 166 introduces a 0.1 clock period delay. If the second component of the precision delay requires a 0.1 clock period delay and delay compensation is needed, the first delay element of the extension delay chain 166 may be used to introduce both the 0.1 clock period precision delay and the 1.0 clock period delay required for delay compensation. If no delay compensation is required, the first delay element of the base delay chain 164 is used to introduce solely the 0.1 clock period delay.

The extended multiplexer 162 is a selector used to select the version of the input signal as delayed by the extended delay chain 156 with the appropriate amount of delay. The multiplexer 162 is coupled to the tap ports of each of the delay elements in the extended delay chain 156 through a plurality of input ports. In addition, the multiplexer 162 is coupled to the controller 106 to receive a selection signal at a selection port (Sel). Based on the selection signal, the multiplexer 162 selects one of the delayed versions of the input signal from the extended delay chain 156 and passes it at an output port. The multiplexer 162 is a conventional multiplexer such as multiplexer 126 described above in reference to FIG. 4.

In use, an input signal is received at an input port (IN). The input signal passes through the first TDLL 112, which is configured by the controller 106 via the first multiplexer 126 to add a first component of the precision delay to the signal. The input signal then passes through the extended TDLL 150 where a second component of the precision delay is added. If the controller 106 identifies that the combination of delays introduced by the first TDLL 112 and the extended TDLL 150 will result in the total delay falling within a first range, the controller 106 controls the extended multiplexer 162 to select the appropriate tap port from the extension delay chain 166 rather than the corresponding tap port from the base delay chain 164 (which are offset from each other by exactly one clock period), thereby effectively placing the total delay in the second range. If on the other hand, the total delay will fall within the second range without delay compensation, the controller 106 selects the appropriate tap port from the base delay chain 164. Accordingly, the total delay will always occur in a single range, e.g., the second clock cycle after the original input signal.

Although the extended TDLL 150 is described and illustrated as a replacement for the second TDLL 114 in the circuit of FIG. 4, it will be readily apparent to those skilled in the art that a similar extended TDLL 150 could be used to replace the first TDLL 112 or both TDLLs 112, 114 in the circuit of FIG. 4.

The present invention may be used for a wide range of applications. The following applications are an illustrative, but by no means exhaustive, list of potential uses for the present invention.

The present invention may be used in periodic delay applications, which involve the delay of a periodic signal. For example, the present invention may be used to shift the phase of a periodic signal and to compensate for propagation delay across a circuit, i.e., de-skew. In addition, the present invention may be used for high frequency phase shifting (e.g., for clock frequencies of up to one (1) GHz and beyond), phased array delay generation, and frequency measurement.

The present invention also may be used to delay a non-periodic signal, such as might be needed for data skewing and data storage.

The present invention may be used with a digital controller for generating pulses with precision widths, generating long pulses with precision widths, and generating asynchronous pulses. In addition, the present invention may be used as a precision frequency divider or multiplier, or as an arbitrary pulse train generator for random number and pattern generators.

The present invention may be used in process control systems such as stimulus/response systems, e.g., HRR radar, where a stimulus is applied to a system and a precise time later a data sample is collected. In addition, the present invention may be used for multiple sample collection and for feedback control.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An apparatus for introducing delay to a signal, said apparatus comprising:
   a first delay circuit configured to introduce a first delay to the signal, said first delay selected from a first set of delays within a first range and a second set of delays within a second range;
   a delay compensation circuit coupled to said first delay circuit, said delay compensation circuit configured to selectively introduce a second delay to the signal; and
   a control coupled to said first delay circuit and said delay compensation circuit, said control for configuring said first delay circuit to select said first delay and configuring said delay compensation circuit, said control configuring said delay compensation circuit to introduce said second delay when said first delay is selected from said first set of delays within said first range.

2. The apparatus of claim 1, further comprising:
   a clock coupled to said first delay circuit and said delay compensation circuit.

3. The apparatus of claim 2, wherein said first range is a first clock period of said clock and said second range is a second clock period of said clock, said first and second clock periods being consecutive.

4. The apparatus of claim 3, wherein said first set of delays within said first range plus said second delay results in a third set of delays in said second range.

5. The apparatus of claim 1, wherein said first delay circuit comprises:
   a first tapped delay locked loop (TDLL) having a clock port for receiving a clock signal, a first control port for receiving a first control signal from said control, an input port for receiving the signal, and an output port for passing a first delayed version of the signal, said first TDLL introducing a first component of said first delay; and
   a second TDLL having a clock port for receiving said clock signal, a second control port for receiving a second control signal from said control, an input port coupled to the output port of said first TDLL for receiving said first delayed version of said signal, and an output port for passing a second delayed version of the signal, said second TDLL introducing a second component of said first delay.

6. The apparatus of claim 5, wherein said first TDLL comprises:
   a first comparator having a first input for receiving said clock signal, a second input for receiving a first feedback signal, and an output for producing a first error correction signal;
   a first delay chain having an input port for receiving said clock signal, an output port for producing said first feedback signal, and a first set of delay elements, each of said first set of delay elements having an error correction port for receiving said first error correction signal;

a second delay chain having an input port for receiving the signal and a second set of delay elements having at least as many delay elements as said first set of delay elements, each of said second set of delay elements having an error correction port for receiving said first error correction signal and a tap port;

a selector having a plurality of inputs coupled to said tap ports of said second delay chain, a control port for receiving a first selector signal from said control to select one of said tap ports, and an output for passing said first delayed version of the signal.

7. The apparatus of claim 6, wherein said second TDLL comprises:

a second comparator having a first input for receiving said clock signal, a second input for receiving a second feedback signal, and an output for producing a second error correction signal;

a third delay chain having an input port for receiving said clock signal, an output port for producing said second feedback signal, and a third set of delay elements, each of said third set of delay elements having an error correction port for receiving said second error correction signal;

a fourth delay chain having an input port for receiving said first delayed version of the signal and a fourth set of delay elements having at least as many delay elements as said third set of delay elements, each of said fourth set of delay elements having an error correction port for receiving said second error correction signal and a tap port;

a selector having a plurality of inputs coupled to said tap ports of said fourth delay chain, a control port for receiving a second selector signal from said control to select one of said tap ports, and an output for passing said second delayed version of the signal.

8. The apparatus of claim 7, wherein said third set of delay elements has one more delay element than said first set of delay elements.

9. The apparatus of claim 7, wherein said third set of delay elements has one less delay element than said first set of delay elements.

10. The apparatus of claim 5, wherein said first TDLL comprises:

a first comparator having a first input for receiving said clock signal, a second input for receiving a first oscillation signal, and an output for producing a first error correction signal;

a first delay chain having an input port, an output port for producing said first oscillation signal, said output port coupled to said input port, and a first set of delay elements, each of said first set of delay elements having an error correction port for receiving said first error correction signal;

a second delay chain having an input port for receiving the signal and a second set of delay elements having at least as many delay elements as said first set of delay elements, each of said second set of delay elements having an error correction port for receiving said first error correction signal and a tap port;

a selector having a plurality of inputs coupled to said tap ports of said second delay chain, a control port for receiving a first selector signal from said control to select one of said tap ports, and an output for passing said first delayed version of the signal.

11. The apparatus of claim 10, said first TDLL further comprising at least oscillation circuitry for initiating said first oscillation signal.

12. The apparatus of claim 10, wherein said second TDLL comprises:

a second comparator having a first input for receiving said clock signal, a second input for receiving a second oscillation signal, and an output for producing a second error correction signal;

a third delay chain having an input port, an output port for producing said second oscillation signal, said output port coupled to said input port, and a third set of delay elements, each of said third set of delay elements having an error correction port for receiving said second error correction signal;

a fourth delay chain having an input port for receiving said first delayed version of the signal and a fourth set of delay elements having at least as many delay elements as said third set of delay elements, each of said fourth set of delay elements having an error correction port for receiving said second error correction signal and a tap port;

a selector having a plurality of inputs coupled to said tap ports of said fourth delay chain, a control port for receiving a second selector signal from said control to select one of said tap ports, and an output for passing said second delayed version of the signal.

13. The apparatus of claim 12, said first TDLL further comprising at least first oscillation circuitry for initiating said first oscillation signal and said second TDLL further comprised at least second oscillation circuitry for initiating said second oscillation signal.

14. The apparatus of claim 1, wherein said delay compensation circuit is a counter.

15. The apparatus of claim 1, wherein said first delay circuit comprises at least:

a first TDLL having a first delay chain and a second delay chain; and a second TDLL having a third delay chain and a fourth delay chain, said fourth delay chain having a base set of delay elements.

16. The apparatus of claim 15, wherein said second TDLL further comprises at least an extension to the fourth delay chain, said extension comprising an extension set of delay elements connected in series with said base set of delay elements.

17. A method for producing uniform delay steps in a Vernier-type circuit including a first set of delays within a first range and a second set of delays within a second range, said method comprising the steps of:

receiving a delay indicator specifying an amount of delay to add to a signal;

introducing a first delay to said signal with the Vernier circuit; and introducing a second delay to said input signal when said first delay is within the first range, said first and second delays together producing a third delay that is within the second range.

18. The method of claim 17, wherein said second delay is introduced to said input signal before said first delay.

19. The method of claim 17, wherein said second delay is introduced to said input signal after said first delay.

20. The method of claim 17, wherein said first and second delays are introduced to said input signal substantially simultaneously.

* * * * *